(12) United States Patent
Watanabe

(10) Patent No.: US 9,247,682 B2
(45) Date of Patent: Jan. 26, 2016

(54) ELECTRONIC CIRCUIT MODULE

(71) Applicant: ALPS ELECTRIC CO., LTD., Tokyo (JP)

(72) Inventor: Yoshikiyo Watanabe, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 197 days.

(21) Appl. No.: 13/944,338

(22) Filed: Jul. 17, 2013

(65) Prior Publication Data
US 2013/0322040 A1     Dec. 5, 2013

(30) Foreign Application Priority Data

Aug. 1, 2012    (JP) .................................. 2012-171370

(51) Int. Cl.
| | |
|---|---|
| H05K 5/00 | (2006.01) |
| H05K 9/00 | (2006.01) |
| H01L 23/60 | (2006.01) |
| H05K 7/18 | (2006.01) |
| H01R 4/00 | (2006.01) |

(52) U.S. Cl.
CPC ............. *H05K 9/0043* (2013.01); *H01L 23/60* (2013.01); *H05K 9/0009* (2013.01); *H05K 9/0024* (2013.01); *H05K 9/0026* (2013.01); *H05K 9/0028* (2013.01); *H05K 9/0037* (2013.01); *H05K 9/0049* (2013.01)

(58) Field of Classification Search
CPC . H05K 9/0009; H05K 9/0024; H05K 9/0026; H05K 9/0028; H05K 9/0037; H05K 2201/0715; H01L 23/60
USPC ......... 361/728, 752, 753, 800, 801, 816, 818, 361/796, 799; 174/350, 371, 372, 373, 377
See application file for complete search history.

(56) References Cited

U.S. PATENT DOCUMENTS

| | | | |
|---|---|---|---|
| 8,362,609 B1 * | 1/2013 | Dosdos et al. | ................. 257/730 |
| 2008/0174984 A1 | 7/2008 | Miyamoto et al. | |
| 2010/0085719 A1 * | 4/2010 | Lu et al. | ......................... 361/782 |

* cited by examiner

*Primary Examiner* — Hoa C Nguyen
*Assistant Examiner* — Binh Tran
(74) *Attorney, Agent, or Firm* — Brinks Gilson & Lione

(57) ABSTRACT

An electronic circuit module includes a circuit board on which electronic components are mounted, and a metal cover covering the circuit board. The metal cover includes a top plate disposed so as to face the circuit board, side plates, and mounting legs. The circuit board has lands to which the mounting legs are joined. The mounting legs each have a bent portion located on the outer periphery of the top plate of the metal cover, and a mounting leg fixing portion in contact with the lands of the circuit board. When seen from the upper surface of the circuit board, the position of the bent portion is on the inner side of the position of the mounting leg fixing portion, and the width of the bent portion is greater than the width of the mounting leg fixing portion.

3 Claims, 9 Drawing Sheets

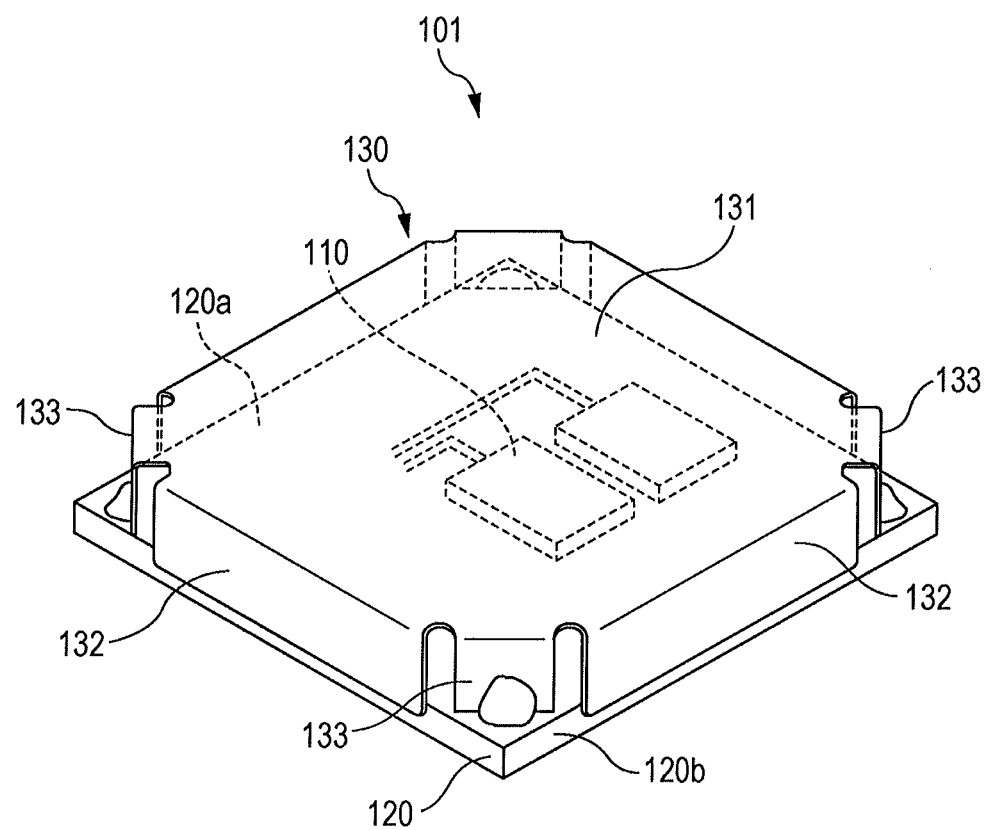

ELECTRONIC CIRCUIT MODULE

CLAIM OF PRIORITY

This application claims benefit of Japanese Patent Application No. 2012-171370 filed on Aug. 1, 2012, which is hereby incorporated by reference in its entirety.

BACKGROUND

1. Field of the Disclosure

The present disclosure relates to an electronic circuit module having a metal cover, and more specifically, it relates to an electronic circuit module in which deformation of a thin metal cover can be prevented.

2. Description of the Related Art

An electronic circuit module is a circuit module in which a high-frequency circuit or the like is formed by a circuit board on which electronic components are mounted. It is built in an electronic device and is used, for example, as an electronic circuit module forming a radio transceiver circuit. It is easy to mount a plurality of electronic circuit modules on a larger-scale circuit board (mother board).

Examples of such an electronic circuit module include a high-frequency tuner module described in US 2008/0174984. FIG. 9 shows a perspective view of the high-frequency tuner module 101 described in US 2008/0174984. As shown in FIG. 9, the high-frequency tuner module 101 includes a circuit board 120 made of a ceramic material, and a shield cover 130 that covers circuit components 110 mounted on a board surface 120a and blocks interfering waves. The shield cover 130 is formed by bending a thin metal sheet into a substantially case shape, and its base surface 131 is disposed parallel to the board surface 120a of the circuit board 120.

The distal ends of four corner side walls 133 of the shield cover 130 are in contact with the four corners of the circuit board 120. By fixing the corner side walls 133 to the circuit board 120, the shield cover 130 is positioned with respect to the board surface 120a of the circuit board 120 in its height direction. Four side walls 132 of the shield cover 130 that are provided so as to correspond to end faces 120b of the square-shaped circuit board 120 are provided so as to extend beyond the board surface 120a of the circuit board 120 along the end faces 120b of the circuit board 120 (in the thickness direction of the circuit board 120).

The shield cover 130 is formed of a metal material. The corner side walls 133 are soldered to GND wires disposed in the four corners of the circuit board 120. The shield cover 130 is thereby fixed to the circuit board 120 and electrically connected with the GND of the circuit board 120. The shield cover 130 covers the circuit components 110 and the like mounted on the board surface 120a of the circuit board 120 and blocks interfering waves from the outside.

As described above, in an electronic circuit module such as a high-frequency circuit, a shield cover (metal cover) is used for blocking electromagnetic waves from the outside. Such a metal cover for blocking electromagnetic waves is often provided so as to cover circuit components (electronic components) mounted on a circuit board, and joined to GND wires (ground wires) of the circuit board. As well as blocking electromagnetic waves from the outside, it prevents high-frequency noise generated by the circuit operation of the electronic circuit module, such as a high-frequency circuit, itself from propagating to the outside.

In recent years, miniaturization of electronic components and development of component mounting technology have progressed, and the area of circuit boards on which electronic components are mounted has been reduced. In an electronic circuit module having a circuit board on which electronic components are mounted and a metal cover, in addition to reduction of the area of the circuit board, miniaturization is required in the height direction. For this reason, the metal cover is provided in such a manner that the clearance between the metal cover and the electronic components is reduced in accordance with the height of the electronic components mounted on the circuit board, and the thickness of the metal sheet from which the metal cover is made has decreased.

However, an electronic circuit module employing a thin metal cover has a problem that the metal cover before joining to the circuit board is deformed owing to drop or external force. The metal cover is formed by cutting and bending a metal sheet by pressing or the like. If the metal cover is dropped or subjected to external force after processing, the metal cover is deformed.

When the metal cover is joined to the circuit board, and if the metal cover before joining to the circuit board is deformed, there is fear that the metal cover is not soldered to the desired position and is soldered to an adjacent different wire. If the deformed metal cover is joined, there is fear that the metal cover is not properly positioned in the height direction and the top plate comes into contact with the electronic components at the time of joining the metal cover.

SUMMARY

An electronic circuit module includes a circuit board on which electronic components are mounted, and a metal cover covering the circuit board. The metal cover includes a top plate disposed so as to face the circuit board, a plurality of side plates bent and extending from the outer periphery of the top plate, and a plurality of mounting legs extending from the four corners of the top plate and joined to the circuit board. The circuit board has a plurality of lands to which the plurality of mounting legs are joined. The plurality of mounting legs each have a bent portion located on the outer periphery of the top plate of the metal cover, and a mounting leg fixing portion in contact with the plurality of lands of the circuit board. When seen from the upper surface of the circuit board, the position of the bent portion is on the inner side of the position of the mounting leg fixing portion, and the width of the bent portion is greater than the width of the mounting leg fixing portion.

The mounting legs of the metal cover are bent at their bent portions from the top plate, and the mounting leg fixing portions are in contact with the lands of the circuit board and are joined to the lands. The mounting legs are formed in such a manner that when seen from the upper surface of the circuit board, the position of the bent portion is on the inner side of the position of the mounting leg fixing portion, and the width of the bent portion is greater than the width of the mounting leg fixing portion. Therefore, the stiffness of the mounting legs can be increased by increasing the width of the bent portions, without increasing the size of the mounting leg fixing portions joined to the lands. Thus, the metal cover before joining to the circuit board is less likely to be deformed when subjected to external force.

Therefore, deformation of a thin metal cover can be prevented.

BRIEF DESCRIPTION OF THE DRAWINGS

FIG. 4A is a semi-transparent plan view of the electronic circuit module seen from the top plate side, and FIG. 4B is a partial enlarged view;

FIG. 9 is a perspective view showing a conventional high-frequency tuner module.

DESCRIPTION OF THE EXEMPLARY EMBODIMENTS

First Embodiment

Figure 1:
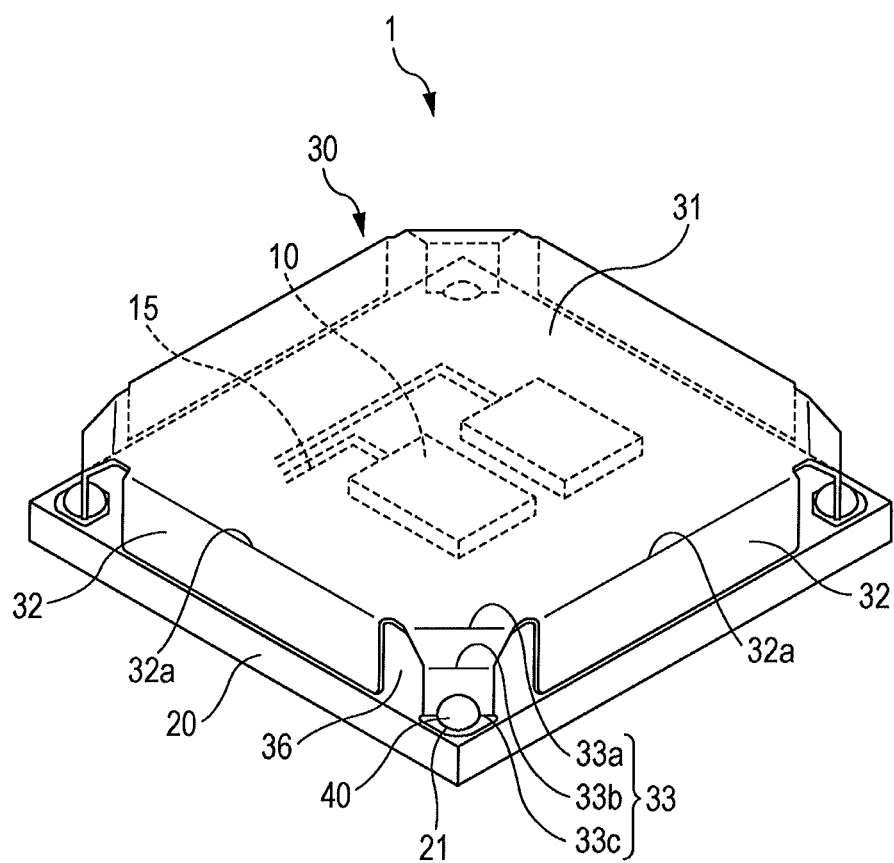
FIG. 1 is a perspective view showing an electronic circuit module of a first embodiment.
Figure 1:
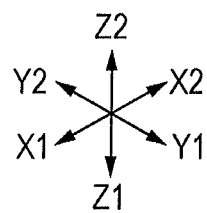
Figure 2:
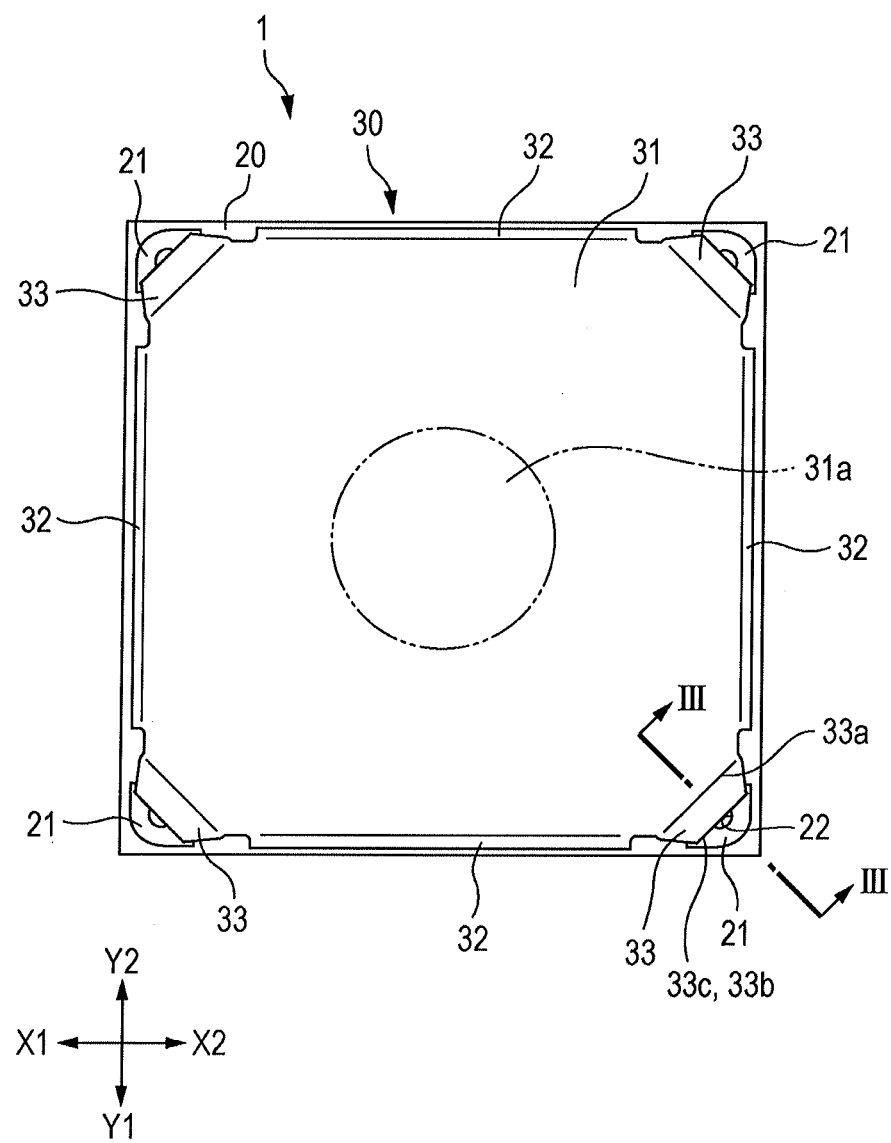
FIG. 2 is a plan view of the electronic circuit module seen from the top plate side.
Figure 3:
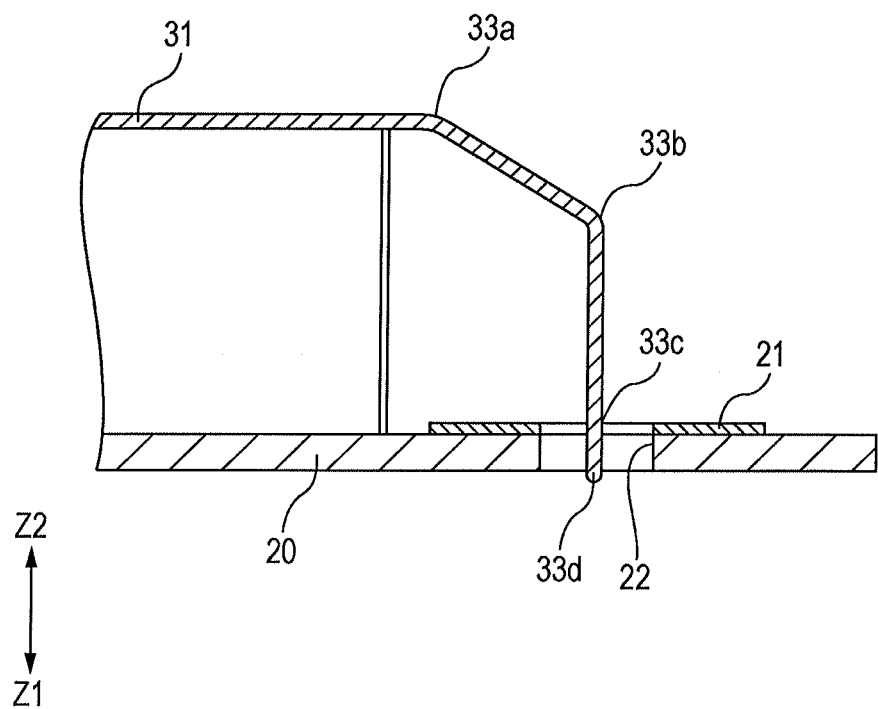
FIG. 3 is a sectional view taken along line of FIG. 2.
Figure 4A:
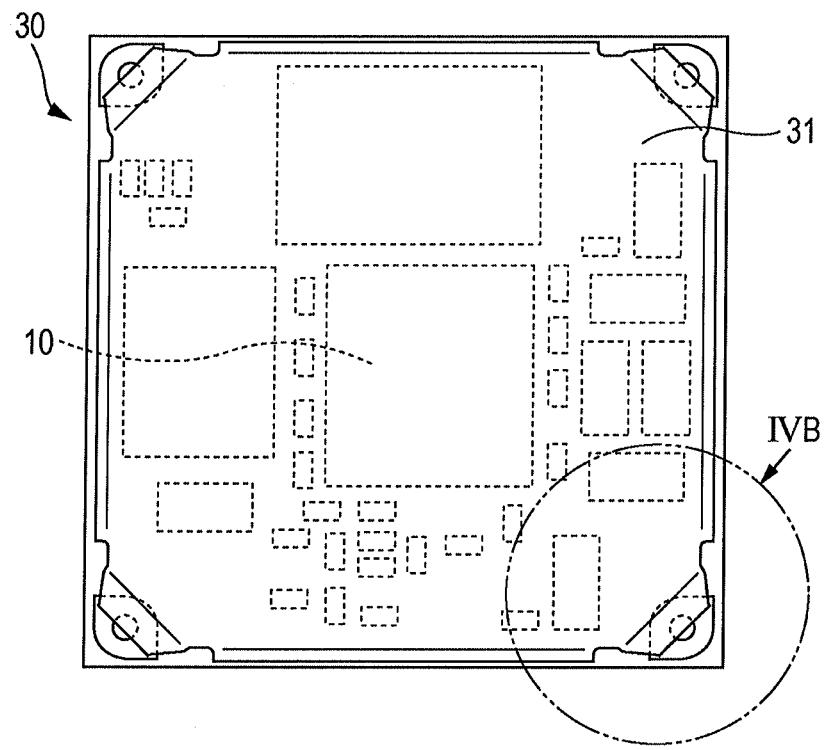
FIGS. 4A and 4B are plan views of the electronic circuit module of the first embodiment.
Figure 4B:
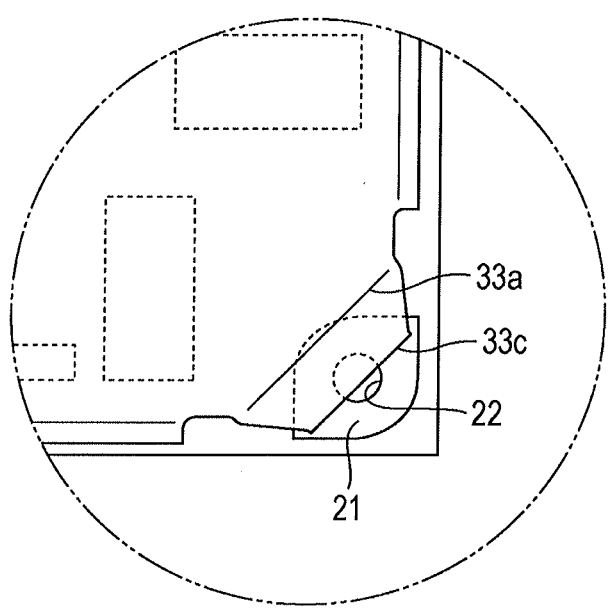
Figure 5:
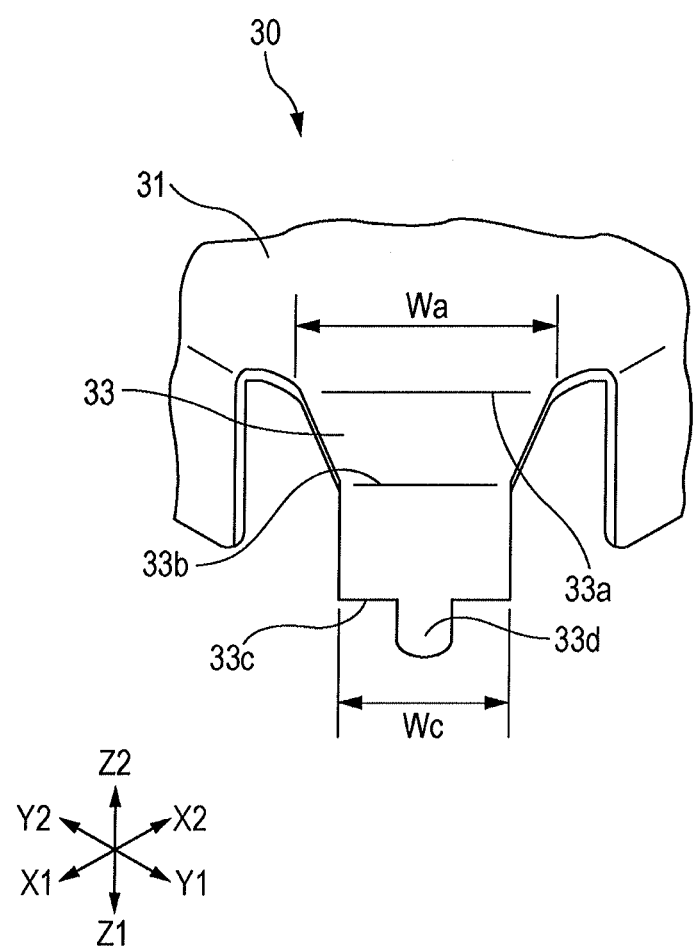
FIG. 5 is an enlarged view of a mounting leg seen from the same direction as FIG. 1.
Figure 6:
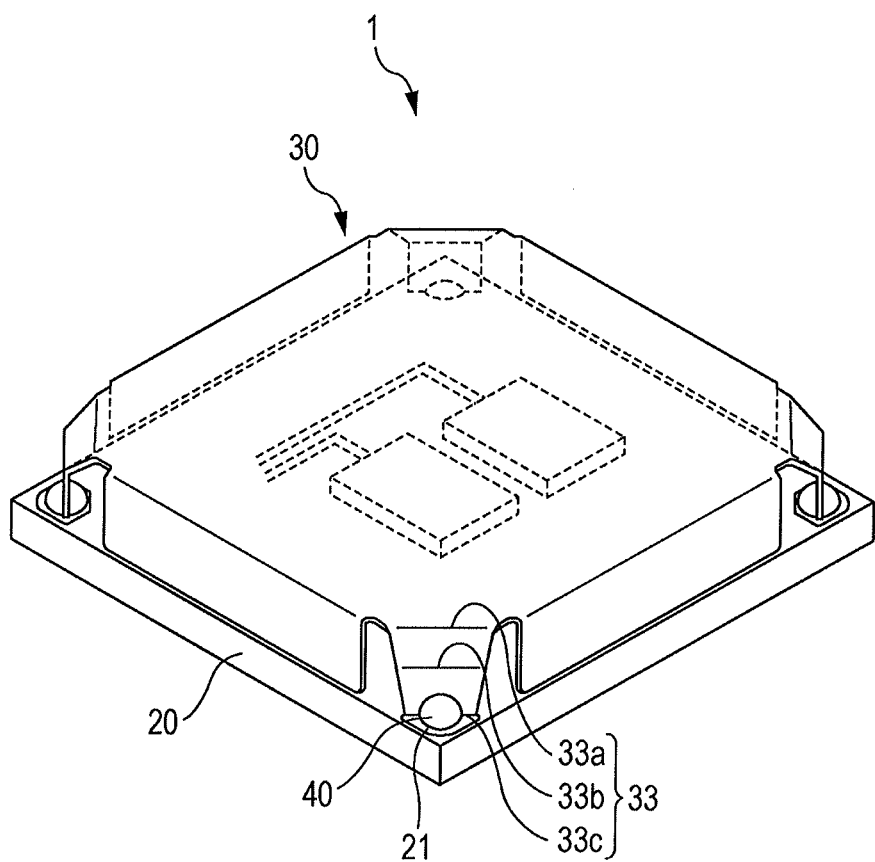
FIG. 6 is a perspective view showing a first modification of the first embodiment.
Figure 6:
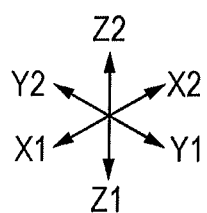
Figure 7:
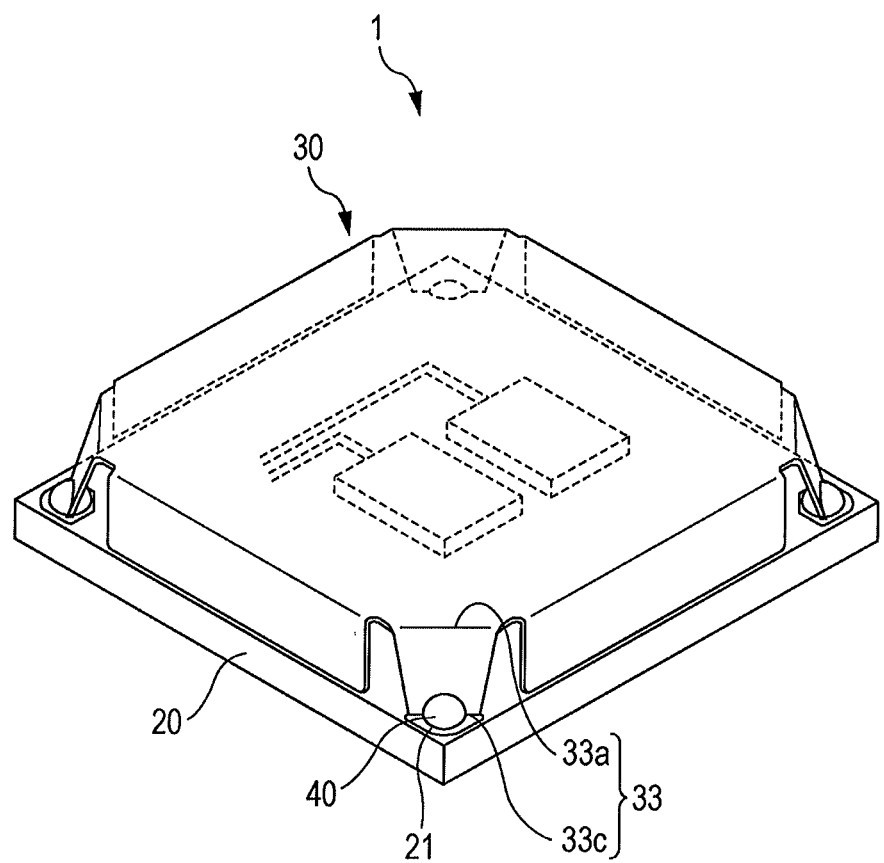
FIG. 7 is a perspective view showing a second modification of the first embodiment.

An electronic circuit module 1 in a first embodiment will be described below. FIG. 1 is a perspective view showing the electronic circuit module 1 of the first embodiment. FIG. 2 is a plan view of the electronic circuit module 1 seen from the top plate 31 side. FIG. 3 is a sectional view taken along line of FIG. 2. FIG. 4A is a semi-transparent plan view of the electronic circuit module 1 seen from the top plate 31 side, and FIG. 4B is a partial enlarged view. FIG. 5 is an enlarged view of a mounting leg 33 seen from the same direction as FIG. 1. FIG. 6 is a perspective view showing a first modification of the first embodiment. FIG. 7 is a perspective view showing a second modification of the first embodiment.

As shown in FIG. 1, a metal cover 30 is disposed so as to cover a circuit board 20. The metal cover 30 includes a top plate 31 that is substantially the same size as the planar size of the rectangular circuit board 20, a plurality of side plates 32 that are bent and extend from the outer periphery of the top plate 31, and a plurality of mounting legs 33 that are each bent at a bent portion 33a and extend from the four corners of the top plate 31. As shown in FIG. 1, the metal cover 30 has a box-like shape the side of which facing the circuit board 20 is open.

Wires 15 made of a conductive material are formed on the circuit board 20. Electronic components 10 are mounted on the circuit board 20 so as to be connected to the wires. The wires 15 and the electronic components 10 are covered by the box-shaped metal cover 30. The circuit board 20 has lands 21, and the mounting legs 33 are joined to the lands 21 with solder 40.

The metal cover 30 is formed in such a manner that the inner surface of the top plate 31 disposed so as to face the circuit board 20 does not interfere with the electronic components 10, and in such a manner that the side plates 32 and the mounting legs 33 have a desired dimension in the height direction (Z1-Z2 direction). The height of the electronic circuit module 1 is the sum of the height (thickness) of the circuit board 20 and the height of the metal cover 30.

When the electronic circuit module 1 is a small electronic circuit module, the external dimensions of the electronic circuit module 1 are about 10 mm×10 mm×1.2 mm, and its metal cover 30 is a thin metal plate having a thickness of about 0.1 mm. The metal cover 30 is made, for example, from a galvanized steel sheet.

As shown in FIG. 1, the plurality of mounting legs 33 and the plurality of side plates 32 are separated by cutouts 36. Each mounting leg 33 extends from a bent portion 33a located on the outer periphery of the top plate 31 through a mounting leg bent portion 33b to a mounting leg fixing portion 33c. The mounting leg fixing portions 33c are in contact with the lands 21, and are joined thereto with solder 40.

The mounting legs 33 of the metal cover 30 are fixed to the circuit board 20 by being joined with solder 40, and are electrically connected to ground wires (not shown). By connecting the mounting legs 33 to the ground wires, the metal cover 30 is held at the ground potential. Thus, electromagnetic waves from the outside are blocked, and high-frequency noise generated by the circuit operation of the electronic circuit module, such as a high-frequency circuit, itself is prevented from propagating to the outside.

As shown in FIG. 2, four mounting legs 33 are disposed at the four corners of the top plate 31 of the metal cover 30 covering the rectangular circuit board 20. In FIG. 2, the depiction of solder 40 is omitted in order to make the planar positional relationship between the circuit board 20 and the mounting legs 33 easier to understand. When seen from the upper surface of the circuit board 20 (from the Z2 direction to the Z1 direction in FIG. 1), in each mounting leg 33, the bent portion 33a and the mounting leg fixing portion 33c are located parallel to each other in plan view, and the position of the bent portion 33a is on the inner side of the position of the mounting leg fixing portion 33c. That is, the bent portion 33a is located closer to the central part 31a of the top plate 31 than the mounting leg fixing portion 33c in plan view. The mounting leg bent portion 33b and the mounting leg fixing portion 33c are located along a plane perpendicular to the circuit board 20, and are therefore located at the same planar position, that is, just above the land 21 in FIG. 2.

As shown in FIG. 2 and FIG. 3, an insertion hole 22 is provided through the circuit board 20 and the land 21. In FIG. 3, the depiction of solder 40 is omitted. The mounting leg 33 has a mounting leg insertion portion 33d extending from the mounting leg fixing portion 33c. In the manufacturing process of joining with solder 40, the mounting leg 33 can be temporarily fixed by inserting the mounting leg insertion portion 33d into the insertion hole 22.

The land 21 has such a shape that a circle having a diameter of about 1 mm and parts of a square circumscribed about the circle are combined, and a diagonal direction of this square corresponds to the width direction of the mounting leg fixing portion 33c. The dimension of the land 21 in the width direction of the mounting leg fixing portion 33c is about 1.4 mm. So, the mounting leg fixing portion 33c is formed to have a width of 1.2 mm. The insertion hole is circular and has a diameter of about 0.35 mm.

As shown in FIG. 2 and FIG. 3, the position of the bent portion 33a is closer to the central part 31a of the top plate 31 than the position of the mounting leg fixing portion 33c. The bent portion 33a is located, for example, 0.4 mm inward.

As shown in FIGS. 4A and 4B, the land 21 and the bent portion 33a are located at about the same planar position. The land 21 is not a space where an electronic component 10 can be disposed on the circuit board 20, and is a dead space on the circuit board 20. Therefore, locating the bent portion 33a inward from the position of the mounting leg fixing portion 33c as shown in FIG. 4A does not affect the miniaturization of the electronic circuit module as long as the bent portion 33a is located at a position substantially just above the land 21 because the position is a dead space where an electronic component is not disposed.

As shown in FIGS. 4A and 4B, the bent portion 33a is located, for example, 0.4 mm inward from the position of the mounting leg fixing portion 33c. Therefore, the width can be greater when bending is performed at the position of the bent portion 33a than when perpendicular bending is performed at the position of the mounting leg fixing portion 33c. As shown in FIG. 5, the width Wa of the bent portion 33a is greater than the width Wc of the mounting leg fixing portion 33c. For example, when the width Wc of the mounting leg fixing portion 33c is 1.2 mm, the width Wa of the bent portion 33a can be 1.6 mm.

Since the width Wa of the bent portion 33a can be greater than the width Wc of the mounting leg fixing portion 33c, the stiffness of the mounting legs 33 can be increased.

Since the stiffness of the mounting legs 33 can be increased, deformation of the metal cover 30 during processing and transportation is less likely to occur. Since deformation of the metal cover 30 before joining can be prevented, there is no trouble when the mounting leg insertion portion 33d is inserted into the insertion hole 22 in the manufacturing process of joining the metal cover 30 to the circuit board 20 with solder 40. If the metal cover 30 before joining is deformed, the top plate 31 of the metal cover 30 may come into contact with the electronic components 10 mounted on the circuit board 20 and may cause failure of the electronic components 10. Since deformation of the metal cover 30 can be prevented, contact between the top plate 31 and the electronic components 10 can be prevented.

If the area of the circuit board 20 is reduced, the size of the lands 21 cannot be reduced. However, when the Wc of the mounting leg fixing portion 33c is increased in order to increase the stiffness of the mounting legs 33, the lands 21 need to be disposed inward from the four corners of the circuit board 20, and the dead space of the circuit board 20 is increased. In this case, in order to make up for the increase of the dead space, the area of the circuit board 20 needs to be increased, and therefore the external dimensions of the electronic circuit module 1 needs to be increased.

In this embodiment, the size of the lands 21 need not be increased. That is, by increasing the width Wa of the bent portions 33a without changing the width Wc of the mounting leg fixing portions 33c joined to the lands 21, the stiffness of the mounting legs 33 can be increased without increasing the dead space of the circuit board 20. Thus, the thin metal cover 30 before joining to the circuit board 20 is less likely to be deformed when subjected to external force. Therefore, the metal cover 30 is suitable for a small electronic circuit module.

As shown in FIG. 3 and FIG. 5, the mounting leg 33 has a mounting leg bent portion 33b between the bent portion 33a and the mounting leg fixing portion 33c. The width of the mounting leg bent portion 33b is less than the width Wa of the bent portion 33a, and is equal to the width Wc of the mounting leg fixing portion 33c.

As shown in FIG. 5, the distance between the mounting leg bent portion 33b and the mounting leg fixing portion 33c in the Z1-Z2 direction is less than the distance between the bent portion 33a and the mounting leg fixing portion 33c. The distance between the mounting leg bent portion 33b and the mounting leg fixing portion 33c is, for example, 0.6 mm. The width Wc of the mounting leg bent portion 33b and the mounting leg fixing portion 33c is, for example, 1.2 mm. Whereas the distance between the bent portion 33a and the mounting leg bent portion 33b is, for example, about 0.6 mm, the width Wa of the bent portion 33a is, for example, 1.6 mm. That is, the mounting leg 33 can be tapered from the bent portion 33a toward the mounting leg bent portion 33b. The stiffness of the mounting legs 33 can thereby be increased, and therefore deformation of the thin metal cover 30 can be prevented.

In this embodiment, the height of the metal cover 30 is restricted by fixing the mounting legs 33 determining the distance between the circuit board 20 and the top plate 31, with solder 40. Since the mounting legs 33 each have the mounting leg bent portion 33b between the bent portion 33a and the mounting leg fixing portion 33c, if the mounting legs 33 are subjected to external force, the mounting legs 33 bend at two places: the bent portion 33a and the mounting leg bent portion 33b and can be elastically deformed so as to absorb the external force. Therefore, if the mounting legs 33 are subjected to an impact due to external force, the impact can be lessened by the elastic deformation of the mounting legs 33.

In this embodiment, the mounting legs 33 each have the mounting leg bent portion 33b between the bent portion 33a and the mounting leg fixing portion 33c. Each mounting leg 33 may be provided with two or more mounting leg bent portions 33b. In this case, it is preferable that the position of the bent portion 33a be not changed, and each mounting leg 33 gradually bend in a part close to the mounting leg fixing portion 33c. In addition, it is preferable that the distance between the mounting leg bent portion 33b and the mounting leg fixing portion 33c be small, only the width of the part therebetween be equal to the width Wc of the mounting leg fixing portion 33c, and the width of the other part located on the bent portion 33a side be greater. If these conditions are satisfied, the stiffness of the mounting legs 33 can be further increased.

The size of the cutouts 36 is preferably as small as possible. In a high-frequency circuit of a high frequency, the smaller the openings, the more effectively electromagnetic waves from the outside are blocked, and high-frequency noise generated by the circuit board 20 can be prevented from propagating to the outside. Similarly, the gap between each side plate 32 and the circuit board 20 is preferably small.

In a modification of this embodiment, as shown in FIG. 6 and FIG. 7, each mounting leg 33 may taper between the bent portion 33a and the mounting leg fixing portion 33c. This simple shape makes it easy to punch the metal cover 30 from a metal sheet before the bent portions 33a and the mounting leg bent portions 33b are bent, and therefore makes the manufacturing process of the metal cover 30 easy.

As shown in FIG. 7, each mounting leg 33 may not have a mounting leg bent portion 33b. When each mounting leg 33 does not have a mounting leg bent portion 33b, the width of the bent portion 33a can be increased by locating the bent portion 33a on the inner side of the mounting leg fixing portion 33c in plan view. The stiffness of the mounting legs 33 can thereby be increased, and therefore deformation of the metal cover 30 due to drop or external force can be prevented. In the manufacturing process of joining the metal cover 30 to the circuit board 20, the mounting leg insertion portions 33d are preferably bent perpendicularly to the surface of the circuit board 20. In other words, each mounting leg fixing portion 33c doubles as a mounting leg fixing portion 33c. In this case, the mounting leg insertion portions 33d can be easily inserted into the insertion holes 22.

Second Embodiment

Figure 8:
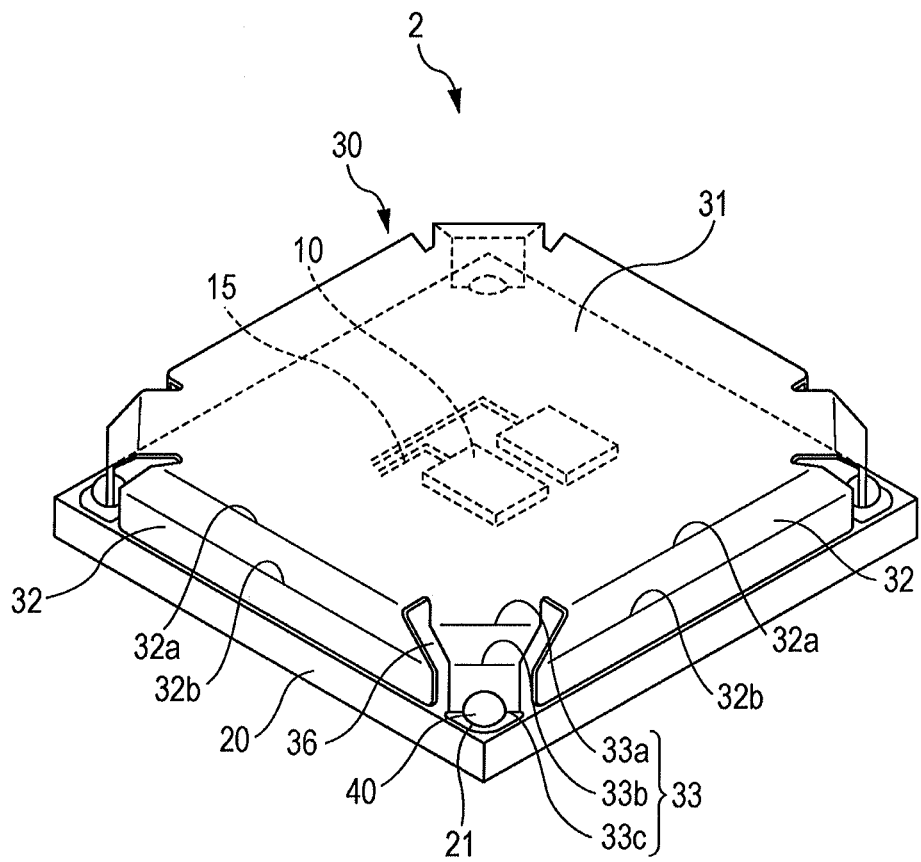
FIG. 8 is a perspective view showing an electronic circuit module of a second embodiment.
Figure 8:
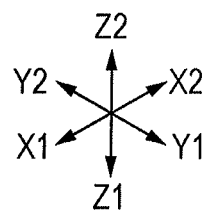

FIG. 8 is a perspective view showing an electronic circuit module 2 of a second embodiment of the present invention. The electronic circuit module 2 differs from the electronic circuit module 1 of the first embodiment in that the side plates 32 each have a first side plate bent portion 32a bent from the top plate 31 of the metal cover 30, and a second side plate bent portion 32b located on the outer side of the first side plate bent portion 32a when seen from the upper surface of the circuit board 20. The components of the second embodiment are the same as those of the first embodiment, and the same reference numerals are used.

As shown in FIG. 8, the first side plate bent portion 32a is located closer to the center of the top plate 31 than the second side plate bent portion 32b. Although the height of the metal cover 30 is restricted by fixing the mounting legs 33 determining the distance between the circuit board 20 and the top plate 31, with solder 40, the side plates 32 may be in contact with the circuit board 20. If the side plates 32 of this embodiment are subjected to external force, the side plates 32 bend at two places: the first side plate bent portion 32a and the second side plate bent portion 32b and can be elastically deformed so as to absorb external force. Therefore, if the side plates 32 are subjected to an impact due to external force, the impact can be lessened by elastic deformation.

In this embodiment, the height of electronic components that can be mounted on the circuit board 20 is restricted on the outer side of the outer periphery of the top plate 31. However, actually the region facing the top plate 31 is sufficiently secured, and therefore the component layout is less restricted. The resistance to impact is increased, and the metal cover 30 looks small in appearance. Therefore, this embodiment is suitable as a small electronic circuit module.

The size of the cutouts 36 is preferably as small as possible. In a high-frequency circuit of a high frequency, the smaller the openings, the more effectively electromagnetic waves from the outside are blocked, and high-frequency noise generated by the circuit board 20 can be prevented from propagating to the outside.

What is claimed is:

1. An electronic circuit module comprising:
    a circuit board on which electronic components are mounted; and
    a metal cover covering the circuit board,
    wherein the metal cover includes a top plate disposed so as to face the circuit board, a plurality of side plates bent and extending from the outer periphery of the top plate, and a plurality of mounting legs extending from the four corners of the top plate and joined to the circuit board,
    wherein the circuit board has a plurality of lands to which the plurality of mounting legs are joined,
    wherein: the plurality of mounting legs each have a bent portion located on the outer periphery of the top plate of the metal cover, and a mounting leg fixing portion in contact with the plurality of lands of the circuit board, the plurality of mounting legs each have at least one mounting leg bent portion between the bent portion and the mounting leg fixing portion, and the width of the mounting leg bent portion is less than the width of the bent portion; and
    wherein when seen from the upper surface of the circuit board, the position of the bent portion is on the inner side of the position of the mounting leg fixing portion, and the width of the bent portion is greater than the width of the mounting leg fixing portion.

2. The electronic circuit module according to claim 1, wherein the plurality of side plates each have a first side plate bent portion bent from the top plate of the metal cover, and a second side plate bent portion located on the outer side of the first side plate bent portion when seen from the upper surface of the circuit board.

3. The electronic circuit module according to claim 1, wherein the mounting leg bent portion comprises a bend at a boundary between a tapered portion and a constant width portion of the mounting leg.

* * * * *